US008889537B2

(12) United States Patent
Cabral, Jr. et al.

(10) Patent No.: US 8,889,537 B2
(45) Date of Patent: Nov. 18, 2014

(54) IMPLANTLESS DOPANT SEGREGATION FOR SILICIDE CONTACTS

(75) Inventors: Cryil Cabral, Jr., Mahopac, NY (US); John M. Cotte, New Fairfield, CT (US); Dinesh R. Koli, Tarrytown, NY (US); Laura L. Kosbar, Mohegan Lake, NY (US); Mahadevaiyer Krishnan, Hopewell Junction, NY (US); Christian Lavoie, Pleasantville, NY (US); Stephen M. Rossnagel, Pleasantville, NY (US); Zhen Zhang, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 648 days.

(21) Appl. No.: 12/833,272

(22) Filed: Jul. 9, 2010

(65) Prior Publication Data

US 2012/0009771 A1    Jan. 12, 2012

(51) Int. Cl.
*H01L 21/28*    (2006.01)
*H01L 21/285*    (2006.01)
*H01L 29/45*    (2006.01)

(52) U.S. Cl.
CPC .... *H01L 21/28512* (2013.01); *H01L 21/28518* (2013.01); *H01L 29/456* (2013.01)
USPC .................................. 438/575; 257/E21.636

(58) Field of Classification Search
USPC ................... 257/E21.623, E21.636, E21.637, 257/E21.154, E21.156; 438/575–576, 438/580–583, 682–683
See application file for complete search history.

(56) References Cited

U.S. PATENT DOCUMENTS

| 4,692,348 | A  | * | 9/1987  | Rubloff et al. | ................ | 438/558 |
| 6,620,719 | B1 | * | 9/2003  | Andry et al. | .................. | 438/597 |
| 7,465,624 | B2 | * | 12/2008 | Nakajima et al. | ............. | 438/233 |
| 2009/0302389 | A1 | * | 12/2009 | Lander et al. | ................. | 257/369 |
| 2010/0200899 | A1 | * | 8/2010  | Marukame et al. | ........... | 257/295 |

FOREIGN PATENT DOCUMENTS

JP    2008243922 A    * 10/2008
JP    2008243992 A    * 10/2008

OTHER PUBLICATIONS

Khater et al., High-K/Metal-Gate Fully Depleted SOI CMOS With Single-Silicide Schottky Source/Drain With Sub-30-nm Gate Length, IEEE Electron Device Letters, Apr. 2010, pp. 275-277, vol. 31, No. 4, IEEE.
Zhang et al., Schottky-Barrier Height Tuning by Means of Ion Implantation Into Preformed Silicide Films Followed by Drive-In Anneal, IEEE Electron Device Letters, Jul. 2007, pp. 565-568, vol. 28, No. 7, IEEE.
Zhang et al., Sharp Reduction of Contact Resistivities by Effective Schottky Barrier Lowering With Silicides as Diffusion Sources, IEEE Electron Device Letters, Jul. 2010, pp. 731-733, vol. 31, No. 7, IEEE.

* cited by examiner

*Primary Examiner* — Matthew W Such
*Assistant Examiner* — Ali Naraghi
(74) *Attorney, Agent, or Firm* — Cantor Colburn LLP; Louis Percello

(57) ABSTRACT

A method for formation of a segregated interfacial dopant layer at a junction between a semiconductor material and a silicide layer includes depositing a doped metal layer over the semiconductor material; annealing the doped metal layer and the semiconductor material, wherein the anneal causes a portion of the doped metal layer and a portion of the semiconductor material to react to form the silicide layer on the semiconductor material, and wherein the anneal further causes the segregated interfacial dopant layer to form between the semiconductor material and the silicide layer, the segregated interfacial dopant layer comprising dopants from the doped metal layer; and removing an unreacted portion of the doped metal layer from the silicide layer.

20 Claims, 12 Drawing Sheets

IMPLANTLESS DOPANT SEGREGATION FOR SILICIDE CONTACTS

FIELD

This disclosure relates generally to the field of silicide contact formation for semiconductor device fabrication, and particularly to adjustment of Schottky barrier height in silicide contacts by implantless dopant segregation.

DESCRIPTION OF RELATED ART

A Schottky junction is a junction between a metal, such as a metal silicide, and a semiconductor material, such as silicon (Si). Schottky junctions may be present in the metal contacts in various semiconductor devices, such as diodes, metal oxide semiconductor field effect transistors (MOSFETs), or solar cells. A Schottky junction has a Schottky barrier height (SBH), which is an origin for a rectifying barrier for electrical conduction at the junction. The magnitude of the SBH reflects the mismatch in the energy position of the majority carrier band edge of the semiconductor material and the metal Fermi level across the metal-semiconductor junction interface. At a metal/n-type semiconductor interface, the SBH is the difference between the conduction band minimum and the metal Fermi level. At a p-type interface, the SBH is the difference between the valence band maximum of the semiconductor and the metal Fermi level. The SBH determines the contact resistance of silicide/silicon contacts. SBH engineering technologies may be employed to reduce the contact resistance of silicide/silicon contacts.

Dopant segregation, or formation of a segregated interfacial dopant layer at the junction between the semiconductor material and the metal, may be used in order to adjust the SBH of a silicided contact to reduce contact resistivities. Dopant segregation may be implantation-based, using pre-silicide implantation, post-silicide implantation, or metal implantation techniques. In pre-silicide implantation, the desired dopants are implanted into the semiconductor material, and then the implanted dopants are snow-plowed to the silicide/Si interface during formation of the metal silicides. In post-silicide implantation, the metal silicide is formed first, and then the dopants are implanted into the silicide, then followed by an extra low-temperature anneal to drive-in the dopants to the silicide/Si interface. In metal implantation, a layer of metal is deposited over the semiconductor material, by, for example, sputtering; the dopants are implanted into the metal; and then the dopants are diffused to the silicide/si interface during the metal silicide formation. However, implantation is a relatively expensive process, and may be too expensive for some cost-limited applications such as solar cells. Further, implantation may form implantation tails in the implanted material, which may cause degradation of short channel effect control of a Schottky junction field effect transistor (FET), especially for p-type FET (PFET) devices.

SUMMARY

In one aspect, a method for formation of a segregated interfacial dopant layer at a junction between a semiconductor material and a silicide layer includes depositing a doped metal layer over the semiconductor material; annealing the doped metal layer and the semiconductor material, wherein the anneal causes a portion of the doped metal layer and a portion of the semiconductor material to react to form the silicide layer on the semiconductor material, and wherein the anneal further causes the segregated interfacial dopant layer to form between the semiconductor material and the silicide layer, the segregated interfacial dopant layer comprising dopants from the doped metal layer; and removing an unreacted portion of the doped metal layer from the silicide layer.

In one aspect, a method for silicide contact formation for a dual contact device includes forming a first contact area and a second contact area in a semiconductor substrate with an insulating region located between the first contact area and the second contact area; forming a first hard mask layer over the first contact area; depositing a first doped metal layer over the second contact area and the first hard mask layer; annealing the first doped metal layer and second contact area, wherein the anneal causes a portion of the first doped metal layer and a portion of the second contact area to react to form a first silicide contact on the second contact area, and wherein the anneal further causes a first segregated interfacial dopant layer to form between the second contact area and the first silicide contact; removing an unreacted portion of the first doped metal layer from the second silicide contact and the first hard mask layer; and removing the first hard mask layer from the first contact area.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Embodiments of a method for implantless dopant segregation are provided, with exemplary embodiments being discussed below in detail. A segregated interfacial dopant layer may be formed in a silicide contact by a silicide process using plated or sputtered metal doped with acceptor atoms, such as boron (B), aluminum (Al), gallium (Ga), or indium (In), for p-type junctions, or doped with donor atoms, such as arsenic (As), phosphorus (P), or antimony (Sb) for n-type junctions. The SBH of the junction is lowered by the segregated interfacial dopant layer. A lower SBH may translate to a lowered contact resistance for the silicide contact. The silicide contact may be for a FET device or a solar cell in some embodiments; reduced contact resistance may improve performance of the FET device, or may increase the efficiency of the solar cell.

Figure 1:
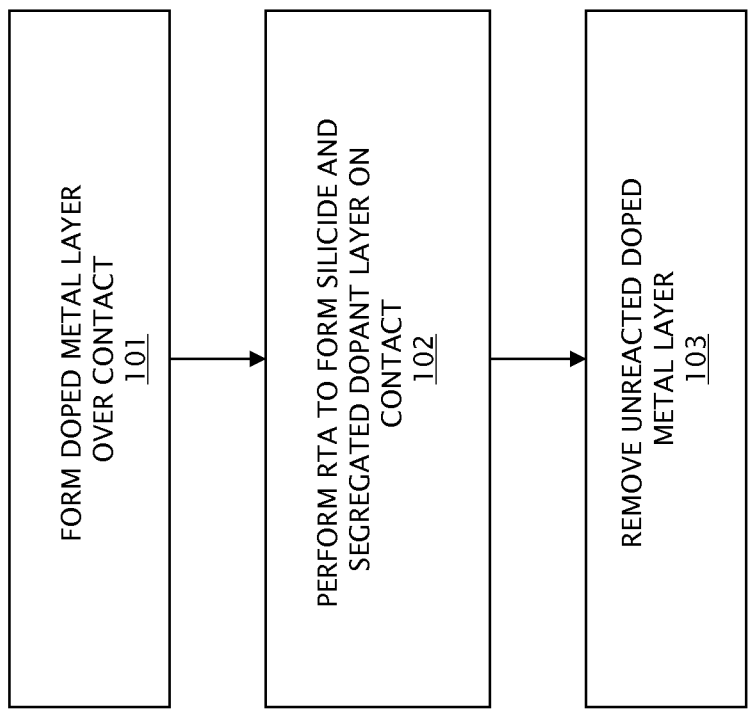
FIG. 1 illustrates an embodiment of a method of implantless dopant segregation.
Figure 2:
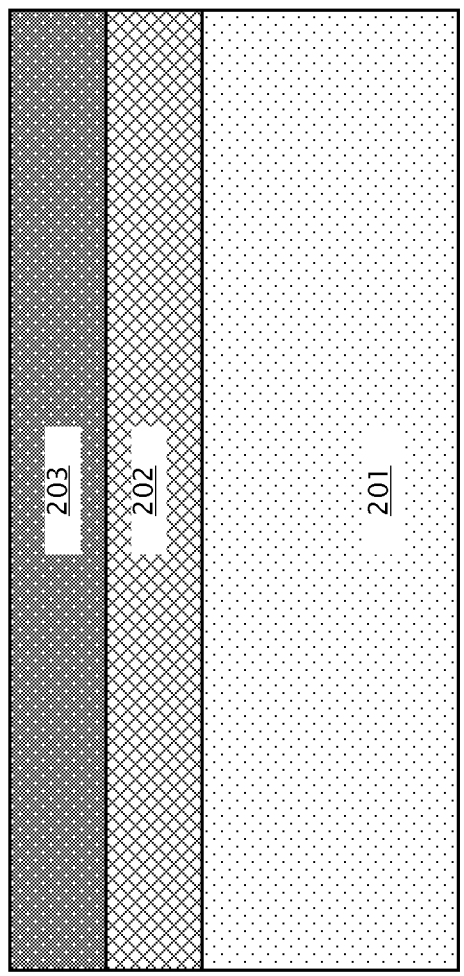
FIG. 2 illustrates an embodiment of a contact region formed on a substrate with a layer of doped metal formed over the contact region.

FIG. 1 illustrates an embodiment of a method 100 for implantless dopant segregation. FIG. 1 is discussed with reference to FIGS. 2-4. In block 101, a doped metal layer 203 is formed on a contact 202 located on a substrate 201, as shown in FIG. 2. The contact 202 may be an n-type contact comprising an n-doped semiconductor material such as Si in some embodiments, or a p-type contact comprising a p-doped semiconductor material such as Si in other embodiments. Substrate 201 may include a semiconductor material such as Si in some embodiments. Doped metal layer 203 may be a donor doped metal layer (including n-type dopants such as As, P, Sb) if the contact 202 is an n-type contact, or an acceptor-doped metal layer (including p-type dopants such as B, Al, Ga, or In) if the contact 202 is a p-type contact. Doped metal layer 203 may be formed by metal plating using a solution including the dopants, or by sputtering with a metal target including the dopants. Doped metal layer 203 may further include one or more of nickel, cobalt, platinum, or titanium in some embodiments.

Figure 3:
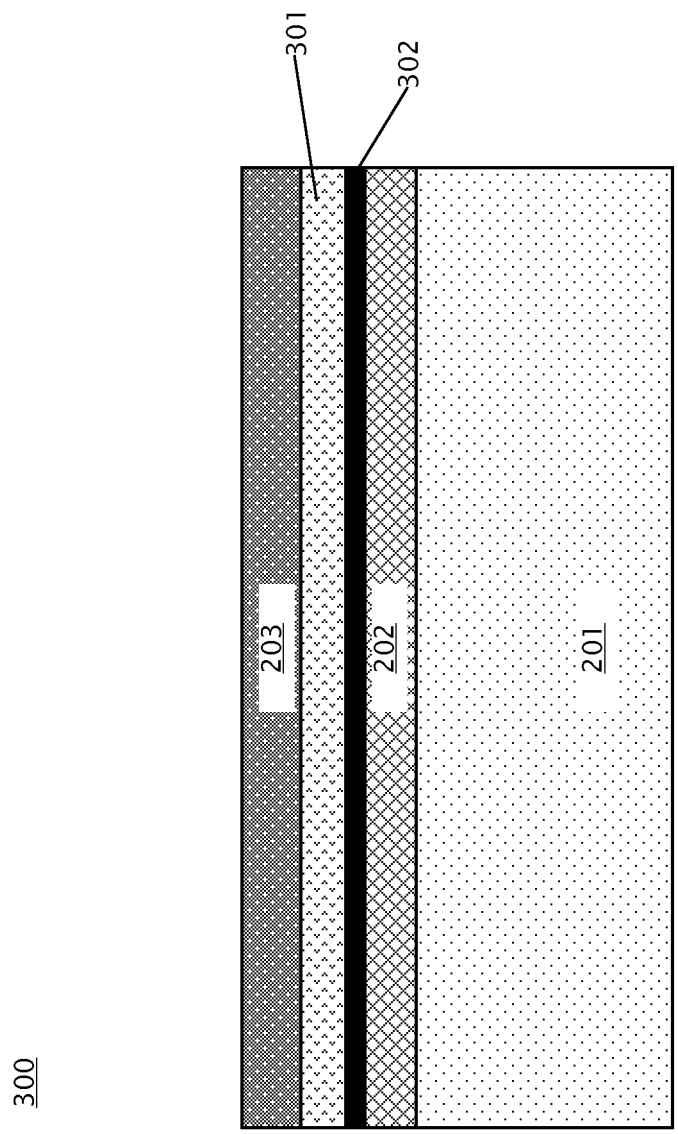
FIG. 3 illustrates an embodiment of the device of FIG. 2 after rapid thermal annealing and silicide formation.
Figure 4:
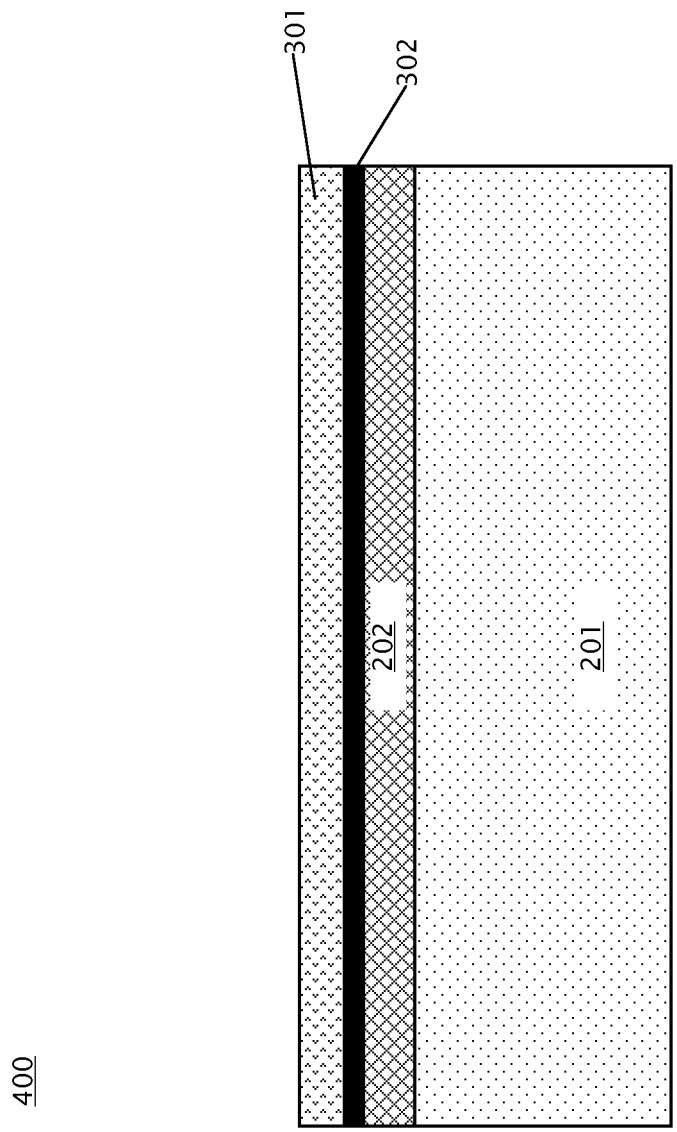
FIG. 4 illustrates an embodiment of the device of FIG. 3 after removal of an unreacted portion of the doped metal layer.

In block 102, after formation of donor doped metal layer 203, the device 200 is rapid thermal annealed (RTA), causing the donor doped metal layer 203 to react with a portion of the semiconductor material comprising contact 202 to form a silicide contact 301, as shown in FIG. 3. A segregated interfacial dopant layer 302 is also formed during the anneal, between contact 202 and silicide contact 301. Segregated interfacial dopant layer 302 acts to lower the Schottky barrier height of the junction between silicide contact 301 and contact 202. In embodiments in which doped metal layer 203 includes n-type dopants, such as As, P, or Sb, the RTA temperature may be relatively higher to cause diffusion of the n-type dopants to segregated interfacial dopant layer 302. The RTA temperature for an n-type anneal may be from about 400° C. to about 700° C. in some embodiments (about 600° C. in some exemplary embodiments). In embodiments in which doped metal layer 203 includes p-type dopants, such as B, Al, Ga, or In, the RTA temperature may be lower than the temperature required for n-type dopants to form segregated interfacial dopant layer 302. The RTA temperature for a p-type anneal may be from about 400° C. to about 700° C. in some embodiments (about 500° C. in some exemplary embodiments). Then, in block 103, an unreacted portion of doped metal layer 203 is removed, resulting in a silicide contact 301 and segregated interfacial dopant layer 302 on contact 202, as shown in device 400 of FIG. 4. The unreacted doped metal layer 203 may be removed by selective wet etching in some embodiments. The device 400 may be a contact for any appropriate type of semiconductor device, such as a FET or a solar cell.

Figure 5:
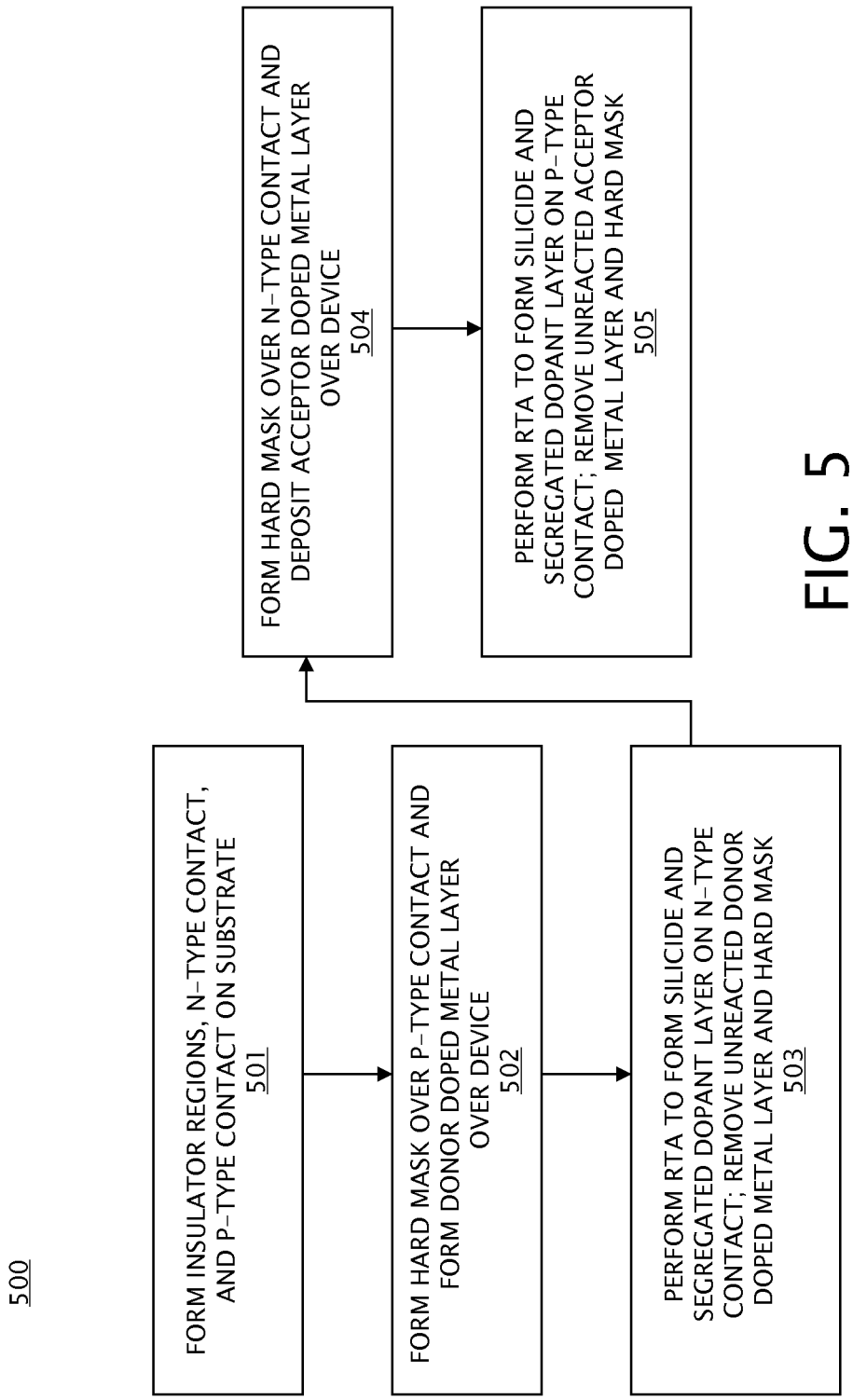
FIG. 5 illustrates an embodiment of a method of implantless dopant segregation for a dual contact device.
Figure 6:
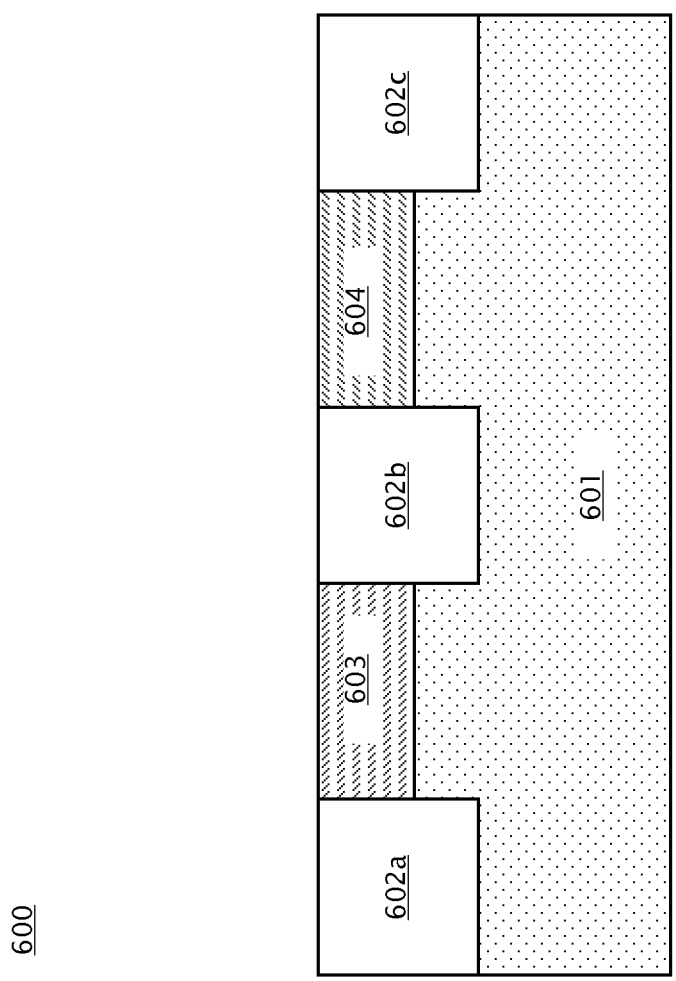
FIG. 6 illustrates an embodiment of insulating regions, an n-type contact, and a p-type contact formed on a substrate.

FIG. 5 illustrates an embodiment of a method 500 for implantless dopant segregation for a dual contact device. FIG. 5 is discussed with reference to FIGS. 6-12. In block 501, insulator regions 602a-c, a p-type contact area 603, and an n-type contact area 604 are formed in substrate 601. Insulator regions 602a-c may comprise silicon oxide ($SiO_2$) in some embodiments. P-type contact 603 may comprise a p-doped semiconductor material such as silicon (Si) in some embodiments, and n-type contact 604 may comprise an n-doped semiconductor material such as Si in some embodiments. Substrate 601 may include a semiconductor material such as Si in some embodiments.

Figure 7:
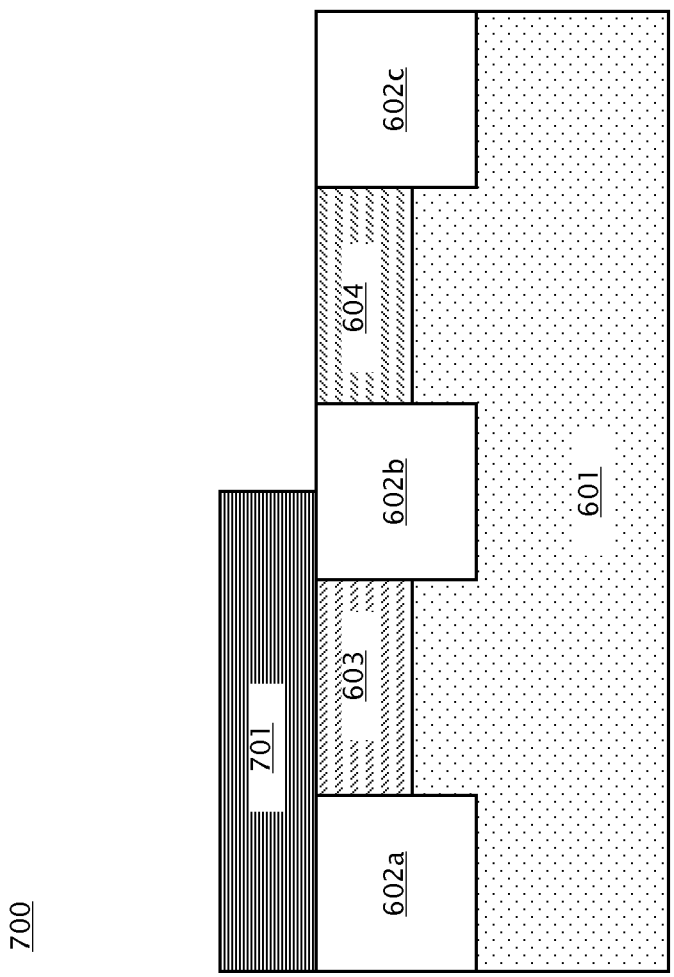
FIG. 7 illustrates an embodiment of the device of FIG. 6 after formation of a hard mask over the p-type contact.
Figure 8:
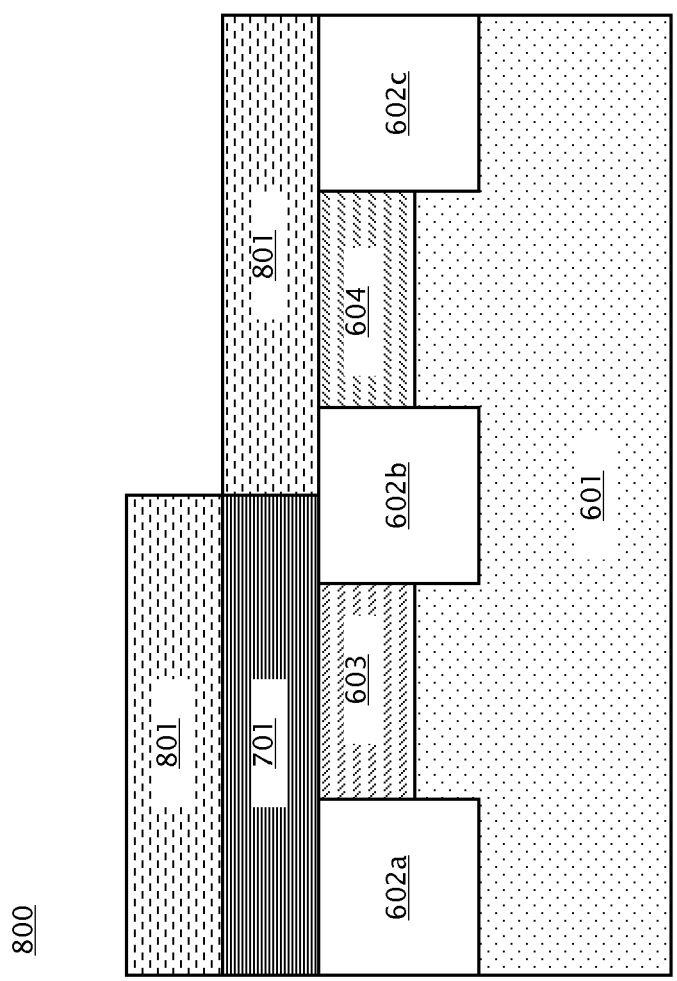
FIG. 8 illustrates an embodiment of a donor doped metal layer formed over the device of FIG. 7.

In block 502, a hard mask 701 is formed over p-type contact 603, as shown in FIG. 7. Hard mask 701 may include silicon oxide in some embodiments. Then, after formation of hard mask 701, device 700 of FIG. 7 is covered with donor doped metal layer 801, as shown in FIG. 8. Donor doped metal layer 801 may be formed by metal plating using a solution including the donor dopants, or by sputtering with a metal target including the donor dopants. Donor doped metal layer 801 may include one or more of nickel, cobalt, platinum, or titanium doped with n-type dopants, such as As, P, or Sb, in some embodiments.

Figure 9:
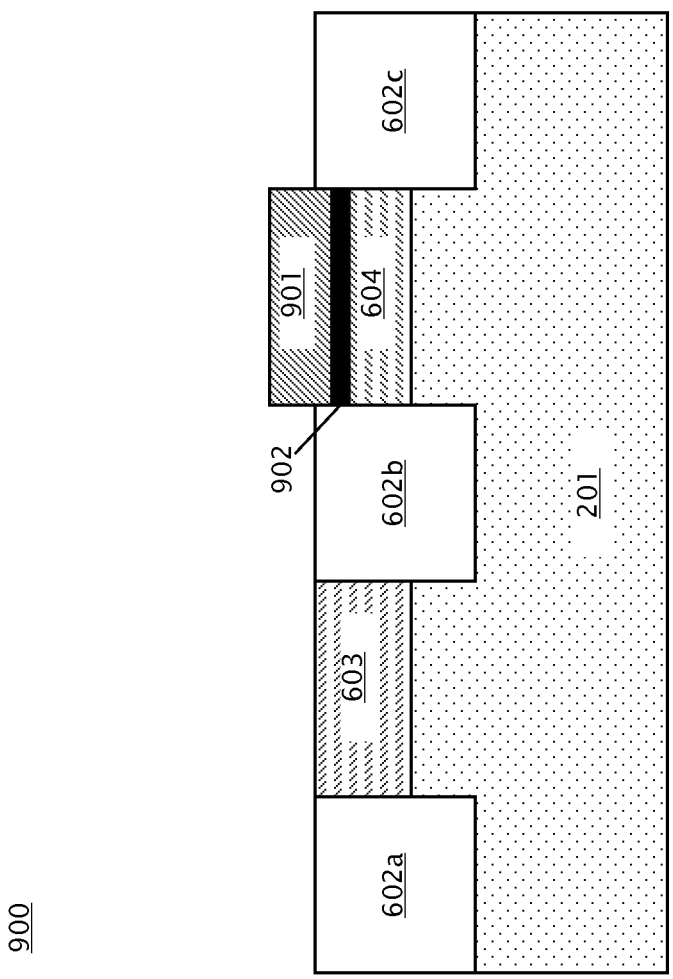
FIG. 9 illustrates an embodiment of the device of FIG. 8 after rapid thermal annealing, silicide formation, and removal of the donor doped metal layer and hard mask.

In block 503, after formation of donor doped metal layer 801, the device 800 is rapid thermal annealed (RTA), causing the donor doped metal layer 801 to react with a portion of the semiconductor material comprising n-type contact 604 to form a silicide contact 901, as shown in FIG. 9. A segregated interfacial dopant layer 902 is also formed during the anneal between n-type contact 604 and silicide contact 901. Segregated interfacial dopant layer 902 acts to lower the Schottky barrier height of the junction between silicide contact 901 and n-type contact 604. The n-type dopants, such as As, P, or Sb, in donor doped metal layer 801 may require a relatively high RTA temperature to cause diffusion of the n-type dopants to segregated interfacial dopant layer 502. The RTA temperature for the n-type anneal may be from about 400° C. to about 700° C. in some embodiments (about 600° C. in some exemplary embodiments). After RTA and silicide formation, any unreacted portion of donor doped metal layer 801 is selectively removed. The unreacted donor doped metal layer 801 may be removed by etching in some embodiments. After removal of donor doped metal layer 801, hard mask 701 is also removed.

Figure 10:
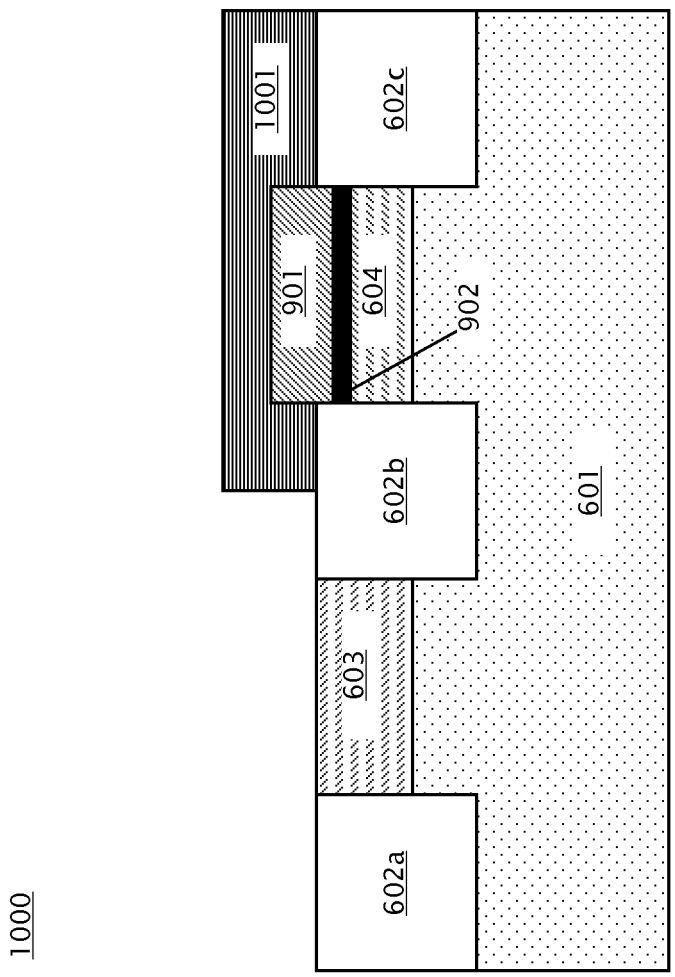
FIG. 10 illustrates an embodiment of the device of FIG. 9 after formation of a hard mask over the n-type contact.
Figure 11:
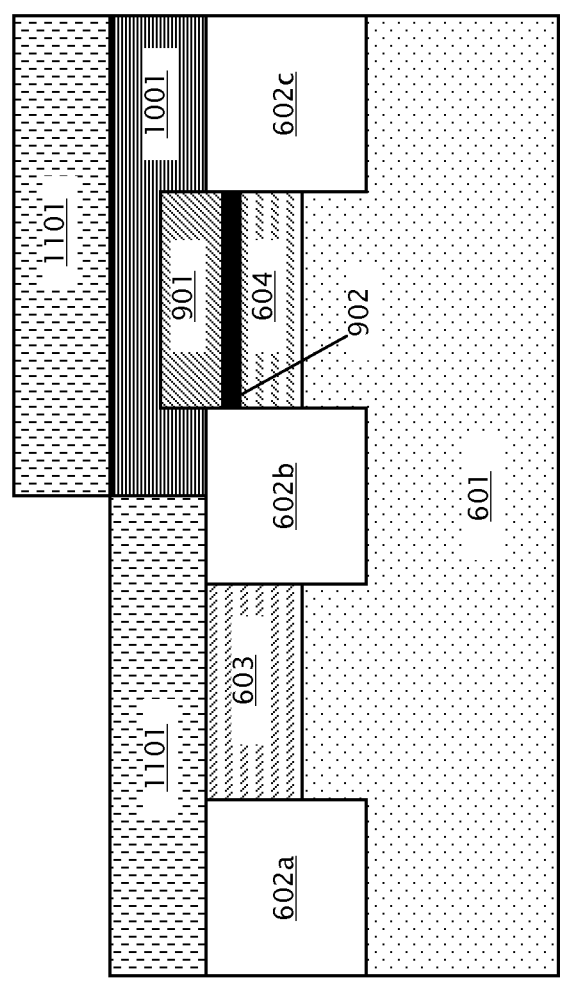
FIG. 11 illustrates an embodiment of an acceptor doped metal layer formed over the device of FIG. 10.

In block 504, a hard mask 1001 is formed over silicide contact 901, as shown in FIG. 10. Hard mask 1001 may include silicon oxide in some embodiments. Then, after formation of hard mask 1001, device 1000 of FIG. 10 is covered with an acceptor doped metal layer 1101, as shown in FIG. 11. Acceptor doped metal layer 1101 may be formed by metal plating using a solution including the acceptor dopants, or by sputtering with a metal target including the acceptor dopants. Acceptor doped metal 1101 may include one or more of nickel, cobalt, platinum, or titanium doped with p-type dopants, such as B, Al, Ga, or In, in some embodiments.

Figure 12:
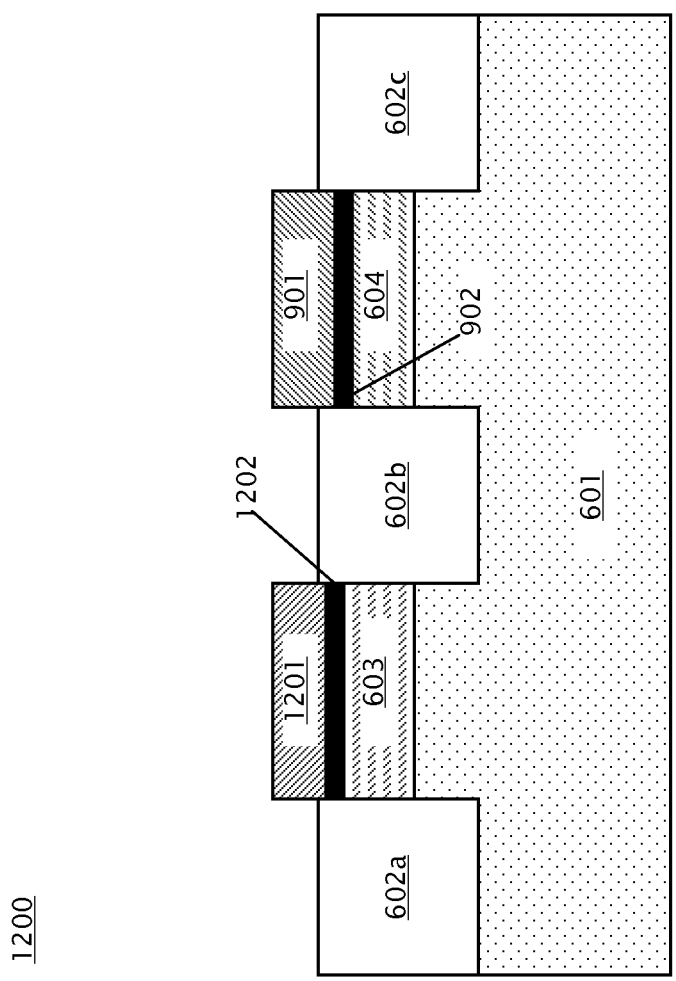
FIG. 12 illustrates an embodiment of the device of FIG. 11 after rapid thermal annealing, silicide formation, and removal of the acceptor doped metal layer and hard mask.

In block 605, after formation of acceptor doped metal layer 1101, the device 1100 is rapid thermal annealed (RTA), causing the acceptor doped metal 1101 to react with a portion of the semiconductor material comprising p-type contact 603 to form silicide contact 1201, as shown in FIG. 12. A segregated interfacial dopant layer 1202 is also formed during the anneal between p-type contact 603 and silicide contact 1201. Segregated interfacial dopant layer 1202 acts to lower the Schottky barrier height of the junction between silicide contact 1201 and p-type contact area 603. The p-type dopants, such as B, Al, Ga, or In, in acceptor doped metal layer 1101 may require a lower RTA temperature, as compared to the n-type dopants in donor doped metal layer 802, to cause diffusion of the p-type dopants to segregated interfacial dopant layer 1202. The RTA temperature for the p-type anneal may be from about 400° C. to about 700° C. in some embodiments (about 500° C. in some exemplary embodiments). After RTA and silicide formation, any unreacted portion of acceptor doped metal layer 1101 is selectively removed. The unreacted acceptor doped metal layer 1101 may be removed by etching in some embodiments. After removal of acceptor doped metal layer 1101, hard mask 1001 is also removed, resulting in device 1200 of FIG. 12. Device 1200 includes segregated interfacial dopant layer 902 at the interface between n-type contact 604 and silicide contact 901, and segregated interfacial dopant layer 1202 between p-type contact 603 and silicide contact 1201. Segregated interfacial dopant layers 902 and 1202 act to lower the SBH at the Schottky junctions between the semiconductor material of contacts 203 and 204 and silicide material of contacts 901 and 1201, resulting in lowered contact resistance for the device 1200.

While method 500 is discussed with respect to p-type contact 603 and n-type contact 604 above, the donor-doped metal and/or acceptor doped metal of method 500 may be used in conjunction with formation of silicide for any appropriate type Schottky junction to form a segregated interfacial dopant layer. Application of hard mask may be performed as necessary to protect any portion of a device area during the silicide process.

The technical effects and benefits of exemplary embodiments include lowering the SBH of a Schottky junction by formation of a interfacial dopant layer without use of implantation.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A method for formation of a segregated interfacial dopant layer at a junction between a semiconductor material and a silicide layer, the method comprising:
    forming a first insulator region and a second insulator region in a semiconductor substrate comprising a semiconductor material, such that a contact area comprising the semiconductor material of the semiconductor substrate is located between the first insulator region and the second insulator region;
    depositing a doped metal layer comprising one or more of nickel, platinum and titanium over the contact area;
    annealing the doped metal layer and the contact area, wherein the anneal causes a portion of the doped metal layer and a portion of the semiconductor material of the contact area to react to form the silicide layer on a remaining portion of the contact area, and wherein the anneal further causes the segregated interfacial dopant layer to form between the remaining portion of the contact area and silicide layer, the segregated interfacial dopant layer comprising dopants from the doped metal layer; and
    removing an unreacted portion of the doped metal layer from the silicide layer.

2. The method of claim 1, wherein the semiconductor material comprises silicon.

3. The method of claim 1, wherein the semiconductor material contact area comprises p-type doped semiconductor material, and the doped metal layer comprise dopants comprising one of boron, aluminum, indium, and gallium.

4. The method of claim 1, wherein the doped metal layer comprises nickel.

5. The method of claim 1, wherein the contact area comprises n-type doped semiconductor material, and the doped metal layer comprise dopants comprising one of arsenic, phosphorus, and antimony.

6. The method of claim 1, wherein depositing the doped metal layer over the contact area comprises metal plating using a solution comprising the dopants.

7. The method of claim 1, wherein the doped metal layer comprises titanium.

8. The method of claim 1, wherein depositing the doped metal layer over the contact area comprises sputtering with a metal target comprising the dopants.

9. The method of claim 1, wherein removing the unreacted portion of the doped metal layer from the silicide layer comprises wet etching.

10. A method for silicide contact formation for a dual contact device, the method comprising:
    forming a first contact area, a second contact area, a first insulating region, a second insulating region, and a third insulating region in a semiconductor substrate comprising a semiconductor material, wherein the first contact area comprises one of an n-type contact and a p-type contact and is located in between and directly in contact with each of the first insulating region and the second insulating region, and wherein the second contact area comprises one of an n-type contact and a p-type contact that is opposite to the first contact area and is located between and in direct contact with each of the second insulating region and the third insulating region;
    forming a first hard mask layer over the first contact area, the first insulating region and the second insulating region, wherein the first hard mask layer completely covers the first contact area;
    depositing a first doped metal layer comprising one or more of nickel, platinum and titanium over the second contact area and the first hard mask layer, wherein the first doped metal layer completely covers the second contact area;
    annealing the first doped metal layer and second contact area, wherein the anneal causes a portion of the first doped metal layer and a portion of the second contact area to react to form a first silicide contact on the second contact area, and wherein the anneal further causes a first segregated interfacial dopant layer to form between the second contact area and the first silicide contact;
    removing an unreacted portion of the first doped metal layer from the second silicide contact and the first hard mask layer; and
    removing the first hard mask layer from the first contact area, the first insulating region and the second insulating region.

11. The method of claim 10, wherein the first doped metal layer comprises nickel.

12. The method of claim 10, wherein the first doped metal layer comprises n-type dopants, the n-type dopants comprising one of arsenic, phosphorus, and antimony.

13. The method of claim 10, wherein the first doped metal layer comprises platinum.

14. The method of claim 10, wherein depositing the first doped metal layer comprises one of metal plating using a solution comprising dopants and sputtering with a metal comprising dopants.

15. The method of claim 10, wherein the first doped metal layer comprises titanium.

16. The method of claim 10, further comprising:
   forming a second hard mask layer over the first silicide contact, the second insulating region, and the third insulating region, wherein the second hard mask layer completely covers the first silicide contact;
   depositing a second doped metal layer over the first contact area and the second hard mask layer, wherein the second doped metal layer completely covers the first contact area;
   annealing the second doped metal layer and first contact area, wherein the anneal causes a portion of the second doped metal layer and a portion of the first contact area to react to form a second silicide contact on the first contact area, and wherein the anneal further causes a second segregated interfacial dopant layer to form between the first contact area and the second silicide contact;
   removing an unreacted portion of the second doped metal layer from the second silicide contact and the second hard mask layer; and
   removing the second hard mask layer from the first silicide contact, the second insulating region, and the third insulating region.

17. The method of claim 16, wherein the second doped metal layer comprises one or more of nickel, platinum, and titanium.

18. The method of claim 16, wherein depositing the second doped metal layer comprises one of metal plating using a solution comprising dopants and sputtering with a metal target comprising dopants.

19. The method of claim 10, wherein the first doped metal layer comprises p-type dopants, the p-type dopants comprising one of boron, aluminum, indium, and gallium.

20. The method of claim 10, wherein removing the unreacted portion of the first doped metal layer from the silicide layer comprises wet etching.

* * * * *